US007961198B2

(12) United States Patent
Dispoto et al.

(10) Patent No.: US 7,961,198 B2
(45) Date of Patent: Jun. 14, 2011

(54) MANAGING COLOR OUTPUT BY APPEARANCE INTENT

(75) Inventors: Gary J. Dispoto, Palo Alto, CA (US); Giordano B. Beretta, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 878 days.

(21) Appl. No.: 11/881,554

(22) Filed: Jul. 27, 2007

(65) Prior Publication Data

US 2009/0027415 A1 Jan. 29, 2009

(51) Int. Cl.

| | |
|---|---|
| ***G09G 5/00*** | (2006.01) |
| ***G09G 5/02*** | (2006.01) |
| ***H04N 11/00*** | (2006.01) |
| ***G03C 7/00*** | (2006.01) |
| ***G03F 3/08*** | (2006.01) |
| ***G06K 9/00*** | (2006.01) |
| ***G06K 9/40*** | (2006.01) |
| *H04N 5/04* | (2006.01) |
| *H04N 5/14* | (2006.01) |
| *H04N 9/64* | (2006.01) |
| *G06F 3/12* | (2006.01) |
| *G06K 9/36* | (2006.01) |

(52) U.S. Cl. ........ 345/589; 345/591; 345/593; 345/600; 345/604; 348/497; 348/502; 348/577; 348/602; 358/518; 358/523; 358/1.1; 382/162; 382/167; 382/274; 382/276; 430/357; 430/358

(58) Field of Classification Search .................. 345/581, 345/589, 591, 593, 600–601, 604, 619; 348/254, 348/263, 441, 467, 469, 497, 502, 520, 557–558, 348/577, 582, 602, 661; 358/1.1, 2.1, 447–448, 358/518–519, 523–524; 430/143, 293
See application file for complete search history.

(56) References Cited

U.S. PATENT DOCUMENTS

| | | | | |
|---|---|---|---|---|
| 5,748,176 | A * | 5/1998 | Gondek | 345/600 |
| 5,754,184 | A * | 5/1998 | Ring et al. | 345/604 |
| 5,995,653 | A * | 11/1999 | Reed et al. | 382/162 |
| 7,545,976 | B2 * | 6/2009 | Gondek et al. | 382/162 |
| 2004/0002023 | A1 * | 1/2004 | Sowinski | 430/505 |
| 2004/0183814 | A1 * | 9/2004 | Saito | 345/601 |
| 2007/0002342 | A1 * | 1/2007 | Morales et al. | 358/1.9 |
| 2007/0064251 | A1 * | 3/2007 | Fan | 358/1.9 |
| 2009/0021754 | A1 * | 1/2009 | Cairns | 358/1.9 |

* cited by examiner

*Primary Examiner* — Wesner Sajous

(57) ABSTRACT

In a method of managing color output by appearance intent a color display value is received. The color display value comprises at least one appearance intent tag and is associated with an item of graphic content. The color display value is converted into an intermediate color value such that an appearance intent specified by the appearance intent tag is preserved in the intermediate color value. The intermediate color value is converted into an output color display value recognizable by an output device, such that the appearance intent is preserved in the output color display value.

20 Claims, 5 Drawing Sheets

MANAGING COLOR OUTPUT BY APPEARANCE INTENT

BACKGROUND

A creator of graphic content does so with an intended appearance. The media on which graphic content is presented (displayed and/or printed) as well as the ambient light conditions in which the graphic content is viewed effect the perception of the color and appearance of the graphic content. This perception can differ from the creator's intended appearance for the graphic content. When color is converted/mapped from one space to another, there may be several possible conversions, yielding the same colorimetric values but a different appearance. Currently, when a creator wants to exert control on the final appearance the creator either has to encode the graphic content for each final rendering device, or else accompany the graphic content with a textual description of the intended appearance so that an another person can later accomplish this encoding.

BRIEF DESCRIPTION OF THE DRAWINGS

The accompanying drawings, which are incorporated in and form a part of this specification, illustrate embodiments of the present technology for managing color output by appearance intent and, together with the description, serve to explain principles of the invention discussed below.

Figure 1:
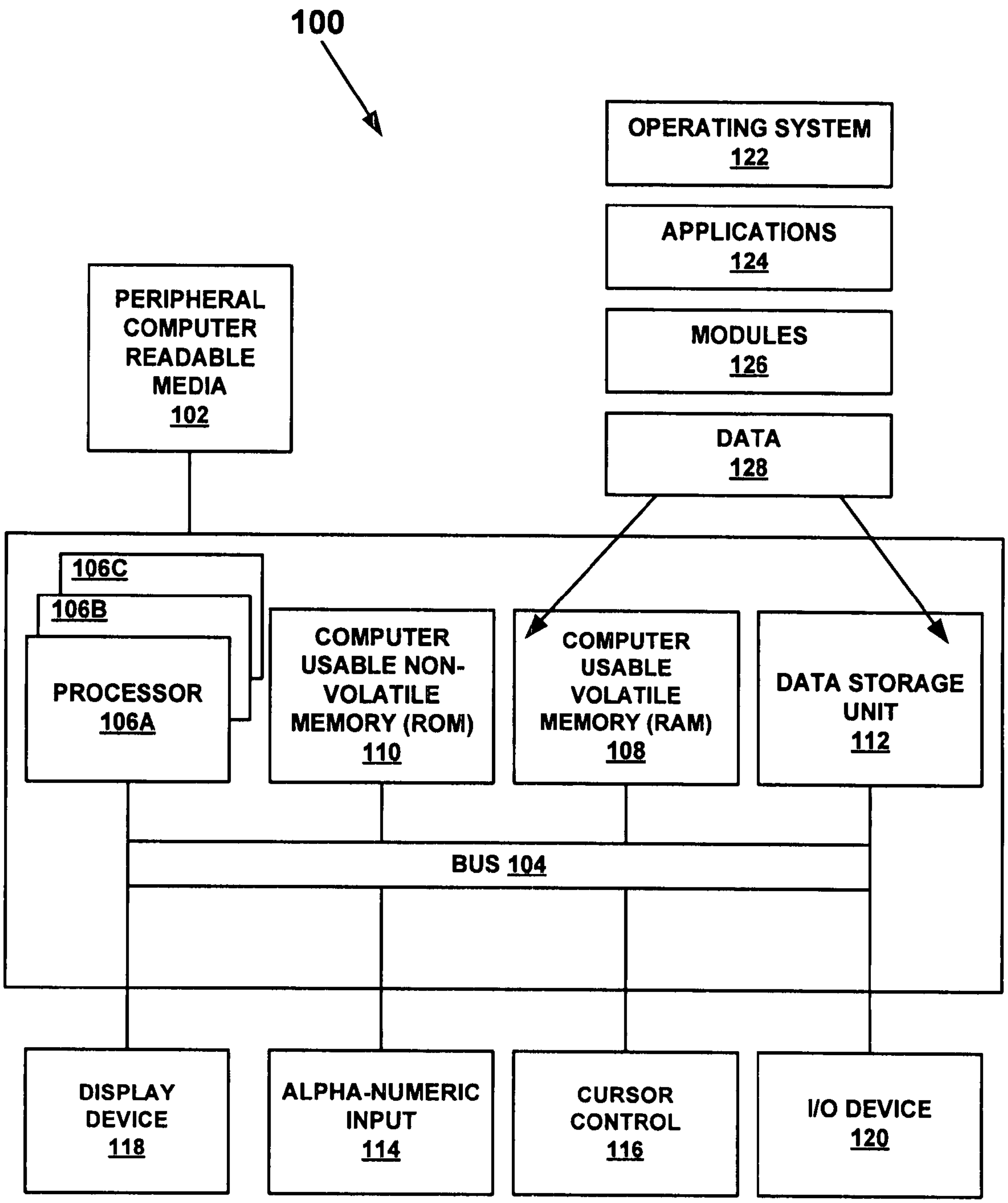
FIG. 1 is a diagram of an exemplary computer system, operable with embodiments of the present invention.

The drawings referred to in this description should not be understood as being drawn to scale unless specifically noted.

DESCRIPTION OF THE EMBODIMENTS

Reference will now be made in detail to embodiments of the present invention for managing color output by appearance intent, examples of which are illustrated in the accompanying drawings. While the subject matter is described in conjunction with various embodiments, it will be understood that they are not intended to limit the present technology to these embodiments. On the contrary, the present technology is intended to cover alternatives, modifications and equivalents, which may be included within the spirit and scope the various embodiments as defined by the appended claims. Furthermore, in the following detailed description, numerous specific details are set forth in order to provide a thorough understanding. However, the present technology may be practiced without these specific details. In other instances, well known methods, procedures, components, and circuits have not been described in detail so as not to unnecessarily obscure aspects of the subject matter being described.

Notation and Nomenclature

Some portions of the detailed descriptions, which follow, are presented in terms of procedures, steps, logic blocks, processing, and other symbolic representations of operations on data bits that can be performed on computer memory. These descriptions and representations are the means used by those skilled in the described arts to most effectively convey the substance of their work to others skilled in their art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system.

Unless specifically stated otherwise as apparent from the following discussions, it is appreciated that throughout the present detailed description, discussions utilizing terms such as "receiving", "converting", "outputting", "coupling", "determining", "applying", "honoring", "displaying", or the like, refer to the actions and processes of a computer system (such as computer 100 of FIG. 1), or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. The present technology is also well suited to the use of other computer systems such as, for example, optical and virtual computers. Additionally, it should be understood that in embodiments of the present technology, one or more of the steps can be performed manually.

As used herein, a "color model operator" is the computational implementation of a color space. A color model operator is typically comprised of: a label identifying the color space (e.g., device RGB (red, green, blue), sRGB (standard RGB), CYMK (cyan, magenta, yellow, key (black)), and CIELAB (Commission Internationale de l'Éclairage L*a*b*)); the type of the color value coordinates (e.g., byte, percentage, value in [0, 1]); an optional tolerance; a list of attributes; and mapping functions to important standard color spaces.

As used herein, a "color display value" is a vector comprising multiple elements containing the coordinates of a color is a given color space. Examples are sRGB coordinates of (255, 128, 128) and CMYK coordinates of (50, 100, 100, 5). A color display value can also be a sample map (a.k.a. image), which is a two-dimensional array of color display values, or a temporal sequence of images. A color display value can also be a named color.

As used herein, a "device profile" is a color model operator for a specific device. A device profile often takes the form of a computer readable file that characterizes a specific device calorimetrically.

As used herein, a "connection profile" (or profile connection space (PCS) is a calorimetric color model operator used as an intermediate color space. Typically color spaces such as tristimulus space XYZ or CIELAB are used. The purpose of a PCS is that when an input device profile and an output device profile both have a mapping function to the same PCS, the two mappings can be linked to produce a mapping from the input to the output device. This greatly reduces the number of required mapping functions.

As used herein, a "color mapping function" is a mechanism for making a transformation from one color space to another. A color mapping function can be an analytic formula, a lookup table, a neural network, or other mechanism for making a transformation from one color space to another.

As used herein, a "color specification" is the storage unit of the specification of a color datum. It consists of a color display value, a color model operator (or a reference to one), and a list of attributes.

As used herein, a "color management system" (CMS) is a system framework that operates on color specifications using the referenced color model operator, taking into account the attribute lists. A color management system also implements the standard color model operators and manages the device profiles.

Overview of Discussion

Embodiments of the present invention address the issue of graphic content being presented with an appearance that is different than that intended by the creator of the graphic content. A creator of graphic content is any entity that will process graphic content prior to a final rendering, such as: a designer, an artist, a graphic content editor, a graphic content proofer, and the like. The creator of graphic content is primarily concerned with the content created with the medium at hand.

Original content is distinguished from captured content. Original content is that which exists in nature and can be perceived by the human visual system (HVS) without any further aid. Examples are landscape scenes, models, and paintings. Captured content is that which has been digitized and encoded in a format suitable for an exemplary computer 100 of FIG. 1. Some examples of captured content are digital photographs and scanned paintings. Content can also be created directly in a computer from a model of the world or any other model. Such content is called synthetic and is exemplified by digital animations, and computer graphics.

The medium can vary from traditional paintings and renderings, to computer graphics. Media run the range from pigmented colors, such as pastels, water colors, and oil paints on paper or canvas; to specialized graphic software developed by production companies such as Pixar Animation and DreamWorks Animation; and in between are publicly available digital media creation tools such as Adobe® Illustrator® and CorelDraw®. Unless the graphic content is viewed on the exact medium with the same ambient light conditions in which it was created, the graphic content may have a different appearance. In the example of a painting or rendering, the creator may not be aware of how his or her graphic content will be reproduced and/or viewed.

In the example of captured content, the reproducer needs to understand and transmit the creator's original content, e.g. a painting was painted for viewing in a large room illuminated by candle light. In the example of digital animations, the appearance of the graphic content can change depending upon the computer, monitor, projector, or printer; such as when an animation is viewed in a movie theater or at home on a computer monitor.

In workflows for graphic arts, color is often specified as ink amounts in the CMYK color space. These four colors are called "process colors". When printing device and medium are known at the time the graphic content is created, they can be early bound to a particular printing device and medium. Expert graphic content creators have become accustomed to creating graphics in CMYK color space. In so doing the graphic content creator can control which process inks create certain colors. For example, a red can be controlled to be printed with two colors, i.e. Y+M. Black can be controlled to be printed with only black ink ("process black" or "pure black") or with "rich black", usually a mixture of all four process inks. To create graphics in a device color space requires an uncommon level of expertise by a graphic content creator, especially when more inks than CMYK are used.

One issue with early bound workflows is document repurposing, i.e. printing or displaying graphic content on a device other than the intended device or medium. Repurposing is particularly an issue when graphic art workflow which a creator has created for display in a particular manner, such as via printing with a particular printer, is redirected to another printer or a display device (e.g., a CRT (cathode ray tube), LCD (liquid crystal display) screen, plasma screen, projected display, or other display device). In these and other instances of repurposing of created graphic content, it is unlikely that the appearance of the graphic content displayed on a repurposed screen display device or other medium will have the appearance that the graphic content creator originally intended.

Embodiments of the present invention provide an appearance intent tag that is coupled to a graphic content such that late bound color management is enabled. The appearance intent tag provides a means for preserving a graphic content creator's intended appearance through the process of being bound to an output device different from the output device for which a creator specified output. A graphic content creator is a person or entity that performs the functions of a designer, an artist, a graphic content editor, a graphic content proofer, and the like. It is appreciated that creating graphic content in a color space related to the input device is more intuitive and requires less expertise than creating graphic content in an output device space. This is because creators have to be familiar and proficient in the use of their input device and hence the color space used by this input device. Most often, the input device's color space is based on RGB (red, green, blue), even though the output color space may be different, such as CMYK (especially if the graphic content is repurposed). As will be seen, embodiments of the present invention enable a content creator of ordinary skill to display and publish content as intended to be displayed and published, rather than relying upon expert skills to create content in CMYK space or some other color space associated with an output device.

Discussion will begin with a description of an example computer system environment with which, or upon which, embodiments of the present invention may operate. Discussion will proceed to a description of an example mechanism for managing color output by appearance intent, operating within the example computer environment. Components of the mechanism will be generally described. Operation of the mechanism and its components will then be described in conjunction with description of example methods for managing color output by appearance intent, and for late bound color mapping.

Example Computer System Environment

With reference now to FIG. 1, portions of embodiments of the present invention are composed of computer-readable and computer-executable instructions that reside, for example, in computer-usable media of a computer system. That is, FIG. 1 illustrates one example of a type of computer that can be used to implement embodiments, which are discussed below, of the present invention. FIG. 1 illustrates an example computer system 100 used in accordance with embodiments of the present invention. It is appreciated that system 100 of FIG. 1 is an example, and that embodiments of the present invention can operate on or within a number of different computer systems including: general purpose networked computer systems, embedded computer systems, optical computer systems, quantum computer systems, virtual computer systems, database systems, server devices, client devices, various intermediate devices/nodes, ASICs (Application Specific Integrated Circuits), PGAs (Programmable Gate Arrays), DSPs (Digital Signal Processors), RIPs (Raster Image Processor), stand alone computer systems, printing devices, display monitors, projection displays, and the like. As shown in FIG. 1, computer system 100 of FIG. 1 is well adapted to having peripheral computer readable media 102 such as, for example, hard disk drive, external flash memory, a compact disc, and the like coupled thereto.

System 100 of FIG. 1 includes one or more address/data bus 104 for communicating information, and a processor 106A coupled to bus 104 for processing information and instructions. From here on, bus 104 will mean one or more buses or any equivalent architecture, such as a crossbar switch or a set of controller hubs like a northbridge and a southbridge. As depicted in FIG. 1, system 100 is also well suited to a multi-processor environment in which a plurality of processors 106A, 106B, and 106C are present. Conversely, system 100 is also well suited to having a single processor such as, for example, processor 106A. Processors 106A, 106B, and 106C may be any of various types of microprocessors, vector processors, co-processors, and graphic processing units.

System 100 also includes data storage features such as a computer usable volatile memory 108, e.g. random access memory (RAM), coupled to bus 104 for storing information and instructions for processors 106A, 106B, and 106C. System 100 also includes computer usable non-volatile memory 110, e.g. read only memory (ROM), coupled to bus 104 for storing static information and instructions for processors 106A, 106B, and 106C. Also present in system 100 is a data storage unit 112 (e.g., a magnetic or optical disk and disk drive or non-volatile solid state memory) coupled to bus 104 for storing information and instructions.

System 100 also includes an optional alphanumeric input device 114 including alphanumeric and function keys coupled to bus 104 for communicating information and command selections to processor 106A or processors 106A, 106B, and 106C. System 100 also includes an optional cursor control device 116 coupled directly or indirectly to bus 104 for communicating creator input information and command selections to processor 106A or processors 106A, 106B, and 106C. System 100 of the present embodiment also includes an optional display device 118 coupled to bus 104 for displaying information.

Referring still to FIG. 1, optional display device 118 may be a LCD, CRT, plasma display device, projection device, or other display device suitable for creating, presenting, or displaying graphic images and/or symbols or alphanumeric characters recognizable to a user. Optional cursor control device 116 allows the computer user to dynamically signal the movement of a visible symbol (cursor) on a display screen of display device 118. Many implementations of cursor control device 116 are known in the art including a trackball, mouse, touch pad, pen, joystick, directional and input keys on a multimedia remote control, or special keys on alpha-numeric input device 114 capable of signaling movement of a given direction or manner of displacement. Alternatively, it will be appreciated that a cursor can be directed and/or activated via input from alpha-numeric input device 114 using special keys and key sequence commands. System 100 is also well suited to having a cursor directed by other means such as, for example, voice commands.

System 100 also includes an I/O device 120 for coupling system 100 with external entities. For example, in one embodiment, I/O device 120 is a modem for enabling wired or wireless communications between system 100 and an external network such as, but not limited to, the Internet.

Referring still to FIG. 1, various other components are depicted for system 100. Specifically, when present, an operating system 122, applications 124, modules 126, and data 128 are shown as typically residing in one or some combination of computer usable volatile memory 108, e.g. random access memory (RAM), and data storage unit 112. In one embodiment, the present technology is stored, for example, as an application 124 or module 126 in memory locations within RAM 108, computer readable media within data storage unit 112, and/or peripheral computer readable media 102.

Color Management System

Figure 2:
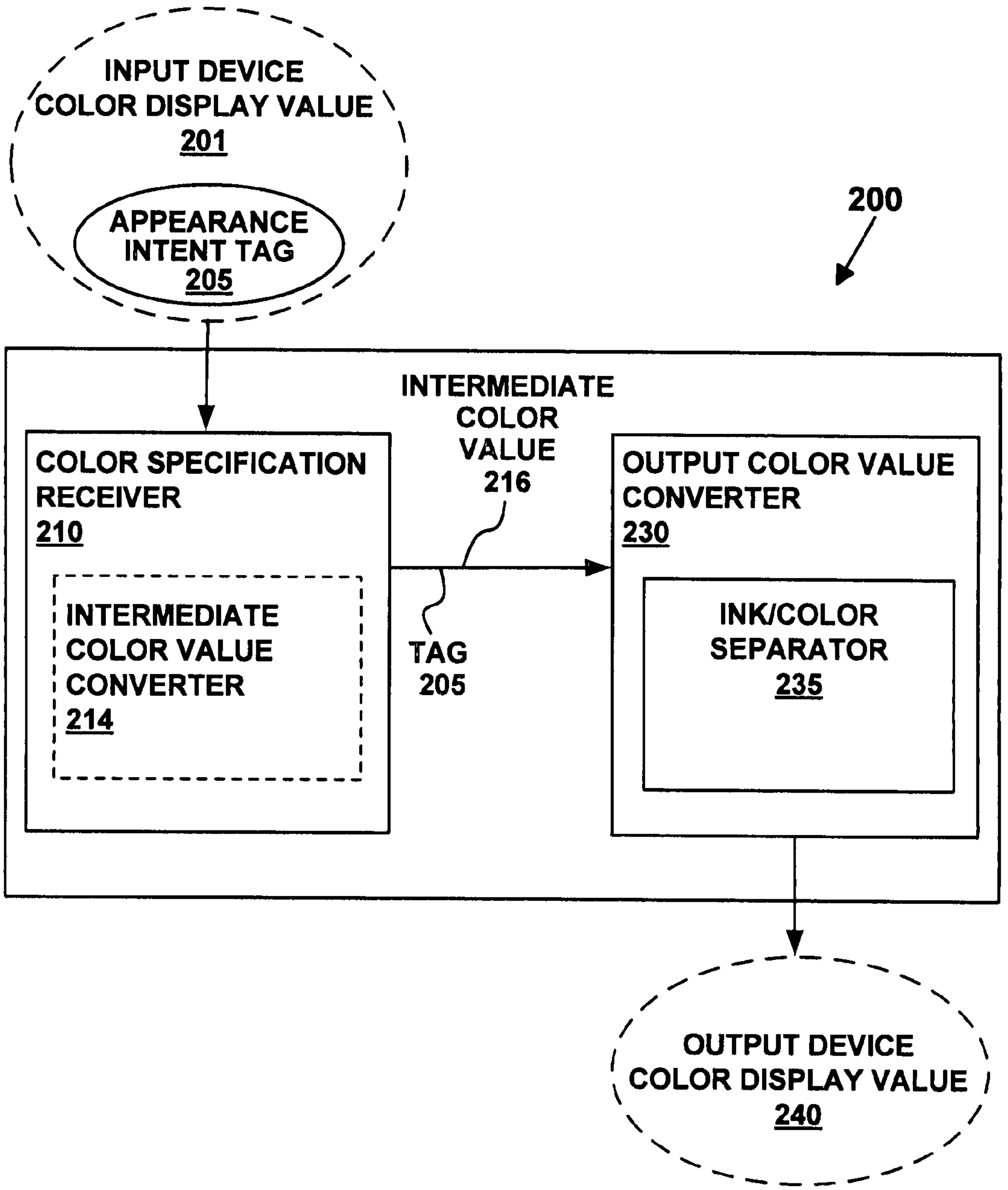
FIG. 2 is a block diagram of a color mapping system, in accordance with an embodiment of the present invention.

With reference to FIG. 2, a block diagram of a color management system (CMS) 200 is shown. It is appreciated that CMS 200 illustrates one example embodiment, and that other configurations within the scope of the present invention are possible. Within the present embodiment, it should be appreciated that the components of CMS 200 may be performed by software, hardware, firmware, or some combination thereof.

CMS 200 is comprised of a color specification receiver 210 which is coupled with an output color value converter 230. In some embodiments, color specification receiver 210 is further comprised of an intermediate color converter 214 which converts a received color specification into an intermediate color model value 216, such as an intermediate color value of a profile connection space. Color output color value converter 230 converts a received color value (e.g., input device color display value 201 or intermediate color value 216) into an output color display value that is recognizable by an output device such as a printer or display device 118. In some embodiments, output color value converter 230 utilizes ink/color separator 235 to specify ink separation for a printer or display colors for a display device.

In accordance with an embodiment of the present invention, an appearance intent tag 205 is encoded in or accompanies a received input color display value 201. Appearance intent tag 205 comprises an output appearance intent which is specified directly or indirectly by the creator of the graphic content which the received input color display value 201 is associated with. The combination of input device color display value 201 and appearance intent tag 205 comprises a color specification associated with all or part of a graphic content job. Appearance intent tag 205 controls the conversion performed by CMS 200 from the received color specification to intermediate color value 216 and finally to an output color display value, such as output device color display value 240. The conversion is controlled such that throughout the conversion process the specified appearance intent for appearance intent tag 205 is preserved. Thus, with reference to FIG. 2 for example, output device color display value 240 represents the appearance intent specified by appearance intent tag 205 in conjunction with input device color display value 201.

CMS 200 recognizes two classes of creator specified intent terms, objective intent terms and subjective intent terms. An objective intent term is a word or phrase used to describe a physical attribute of control over color rendering. An example of an objective intent term is a Boolean parameter controlling the rendering of the color "rich black." Another example of an objective intent term is a gray component replacement (GCR) or an under color removal (UCR) curve used to achieve a pure black.

A subjective intent term is a word or phrase used to describe a subjective attribute of color rendering in the graphical arts terms and vernacular, such as "snap," "softness", "richness," "transparency," "granularity", "smoothness," and "purity." In one embodiment, appearance intent tag 205 captures these and/or other subjective intent terms to reflect the appearance intent of the creator of an item of graphic content. In the case of subjective terms, CMS 200 then receives one more subjective intent terms from appearance intent tag(s) 205 and translates the graphical arts meaning attached to these and other subjective intent terms of this vernacular into objective intent terms recognizable by a device driver operable in a device, such as a printer or a display device.

In some cases, creators may know exactly which objective intent they desire, for example "rich black." In other cases they cannot know. For example, suppose the creator would like to achieve muted, pastel-like colors and has used a color managed system to achieve this subjective intent. The image may be rendered correctly on a desktop CRT display and a printer when these are color managed. A specific example of this is a soft rich black color. However even though a creator successfully renders a particular color on an input device being used to graphic content, the particular color may not be rendered correctly in accordance with the creator's subjective intent on an output device such as a laptop computer, because laptops are available either with a matte or a glossy or bright screen. Thus, on the glossy screen, which has increased contrast and hypersaturated colors, CMS 200 will have to desaturate the graphic object to achieve the creator's desired subjective intent. This example shows the need for expressing both objective and subjective intent in appearance intent tags 205.

In accordance with an embodiment of the present invention, appearance intent tag 205 can also control metamerism, i.e. the perception or appearance of graphic content in different ambient light, and balances metamerism with graininess of the graphic content.

In accordance with an embodiment of the present invention, appearance intent tag 205 may control the economic use of color. For instance, a graphic content on disposable packaging material (e.g. a cardboard box) may not require the same color quality as a photograph or poster. Thus, in one example, appearance intent tag 205 would specify the graphic content creator's intent to limit the use of inks to two inks, to provide an economic use of colors for printing the disposable packaging material. For example, instead of using four inks (Cyan, Magenta, Yellow, and Black) to print, only two inks (Cyan and Black) would be specified for use. This saves money by allowing bulk purchase of these two inks, it also saves money if these inks happen to be less expensive than the Magenta and Yellow inks.

These examples show that the appearance intent tags 205 can be used to differentiate products. Additionally, an inexpensive peripheral device (such as a home printer) may use a simple mapping, while an expensive peripheral device (such as a commercial printer) may use a complex mapping. Furthermore, the quality of the output from different manufacturer's devices will be different based on the skills of the color scientists employed by the manufacturer.

As previously described, color specification receiver 210 is configured to receive a color specification comprising an input device color display value 201 and an appearance intent tag 205. In one embodiment, the input device color display value is an RGB color display value for a portion of an item of graphic content. For example, the RGB color display value may be associated with an input color space of the input device that was used to create the item of graphic content. As can be appreciated by those skilled in the art, although RGB is a common input color space, others can be used. That is, in other embodiments a received input device color display value 201 may be formatted for another input color space other than the RGB input space.

Appearance intent tag 205 is defined from information provided by the creator of graphic content such that the creator's intended appearance for all or a portion of the item of graphic content is defined and "tagged" to input device color display value 201, which for purposes of the example illustrated herein is an RGB color display value. Appearance intent tag 205 is encoded with or tagged to input device color display value 201 such that it does not interfere with interpretation of input device color display value 201 by a system or device which is unable to read and/or interpret appearance intent tag 205.

As shown in FIG. 2, color specification receiver 210 may comprise intermediate color value converter 214. In one embodiment of CMS 200 where the received input device color display value 201 is dependent upon the input color space of the input device, intermediate color converter 214 converts the received input device color display value 201 to a device independent color display value 216 in the form of a PCS (profile connection space) color display value. A PCS color display value is a value in an intermediate colorimetric color display space that is recognizable by an output color value converter 230, which in one embodiment may be incorporated as a device driver for, or within, an output device such as a printer or a display device. It is appreciated that intermediate color converter 214 performs this conversion or transformation in one of a variety manners, such as via mathematical transformation from one color space to another, via lookup table, or via a mapping from one color space to another.

It is appreciated that in one embodiment, an input device used by a creator of graphic content may be configured such that its device color space is a PCS. Such an input device can output color display values in its native color space or can perform a mapping from its native color space to a PCS. In such embodiments, where a received color model operator is already formatted in a PCS color space, no conversion or transformation to an intermediate color value need be performed by color specification receiver 210. It is also appreciated that in some embodiments, an input device color display value 201 may be passed directly to output color value converter 230 along with appearance intent tag 205.

Output color value converter 230 receives at least one intermediate color value 216 for an item of graphic content from color specification receiver 210. In one embodiment information from appearance intent tag 205 is received in conjunction with receipt of the intermediate color value 216. Output color value converter 230 then converts or maps intermediate color value 216 to an output device color display value 240 recognizable by an output device.

For example, with reference to FIG. 2, the output device recognizes CMYK color commands, so output color value converter 230 converts intermediate color value 216 to a CMYK color value. This conversion or mapping from intermediated color value 216 to output device color display value 240 may be accomplished in a number of ways. For example, in one embodiment, a lookup table comprising an array of color definitions in PCS color space is associated with an array of color definitions defined in CMYK color space. As an example of a lookup table conversion, "rich black" in PCS color space may be defined as (0, 0, 0). In one embodiment this is mapped to the definition of rich black (60, 0, 0, 255) in CMYK color space. Another example of PCS to CMYK mapping comprises at least one equivalency formula that identifies an ink and/or color expressed in PCS as a formula for the same color expressed in CMYK. In one embodiment, the content of appearance intent tag 205 is both used and preserved through the process conversion/mapping of PCS color model operator to a color model operator for an output device (e.g., output device color display value 240).

Thus with respect to this one example of operation, it can be seen that CMS 200 receives an input device color display value 201 that is specified in the RGB color space with an accompanying appearance intent tag 205. CMS 200 then converts RGB color display value to output device color display value 240 in the CMYK color space, while preserving the graphic content creator's appearance intent as specified in appearance intent tag 205. In such a manner, CMS 200 allows an item of graphic content to be repurposed and bound to a device which operates in a different color space than the input device which was used to create the item of graphic content. Moreover, the CMS 200 allows the item of graphic content to be displayed and or printed with a similar level of color control as if the color display value for the item of graphic content had been created by the graphic content creator in the color space of the output device.

Example Methods of Operation

Figure 4:
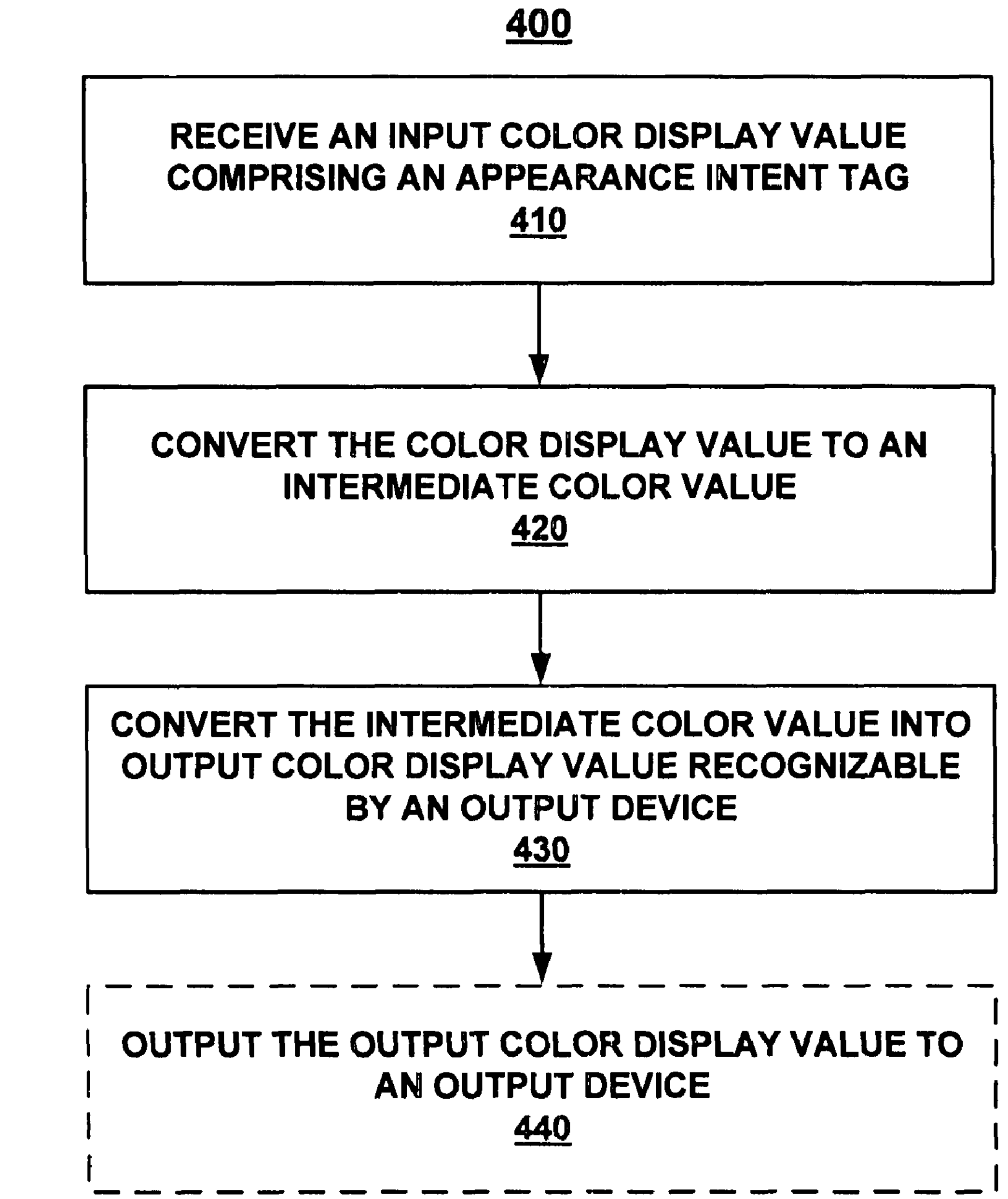
FIG. 4 is a flow diagram of a method for managing color output by appearance intent, in accordance with an embodiment of the present invention.
Figure 5:
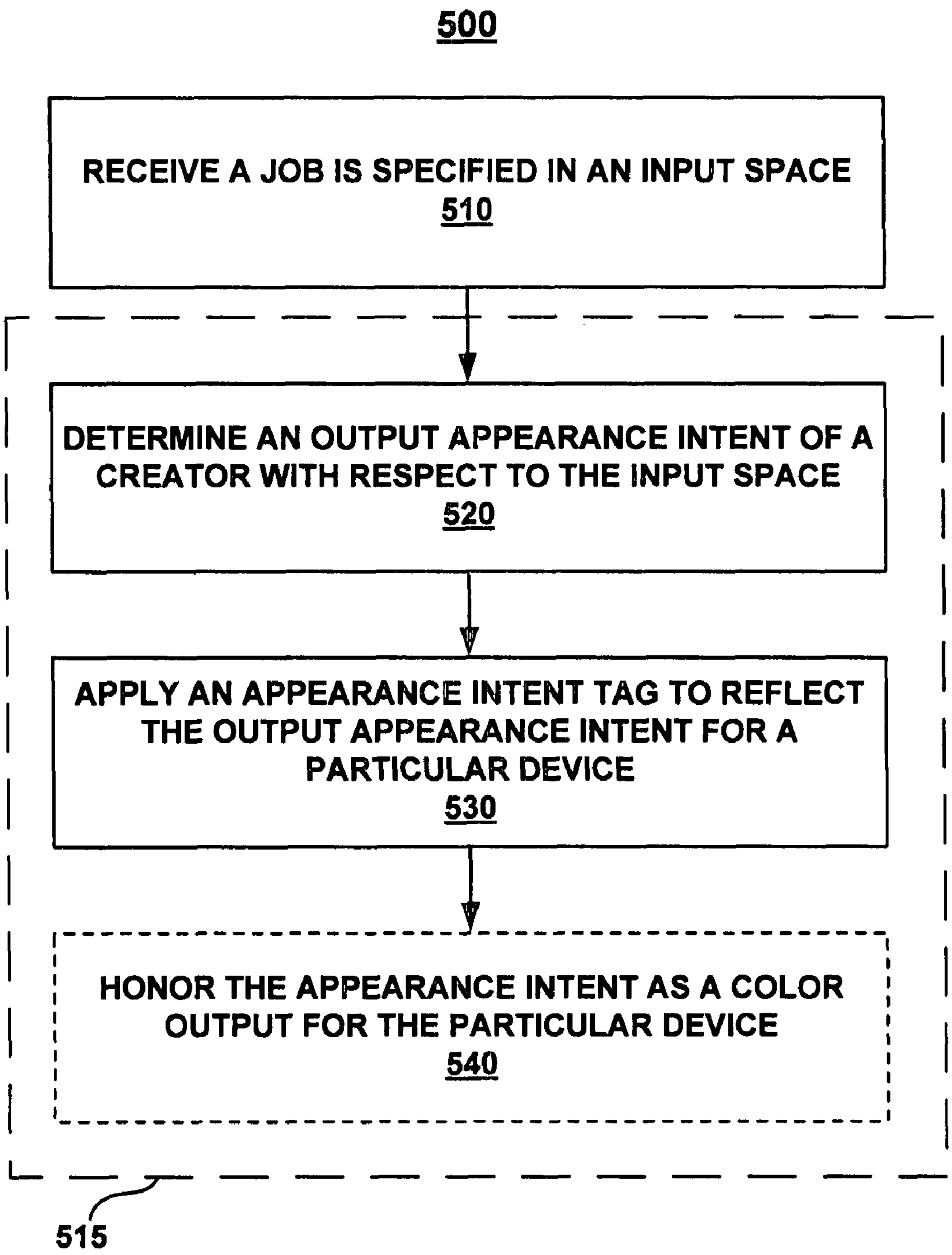
FIG. 5 is a flow diagram of a method for late bound color mapping, in accordance with an embodiment of the present invention.

The following discussion sets forth in detail the operation of present technology through description of example embodiments. With reference to FIGS. 4 and 5, flow diagrams 400 and 500 each illustrate example steps used by methods and/or processes according to various embodiments described herein. Flow diagrams 400 and 500 include processes that, in various embodiments, are carried out by a processor under the control of computer-readable and computer-executable instructions. The computer-readable and computer-executable instructions reside, for example, in data storage features such as computer usable volatile memory 108, computer usable non-volatile memory 110, and/or data storage unit 112 of FIG. 1. The computer-readable and computer-executable instructions are used to control or operate in conjunction with, for example, processor 106A and/or processors 106A, 106B, and 106C of FIG. 1. Although specific steps are disclosed in flow diagrams 400 and 500, such steps are examples. It is appreciated that embodiments described herein are well suited to performing various other steps or variations of the steps recited, that the recited steps may be performed in an order different than presented, and that not all of the recited steps may be performed in every embodiment.

Method for Managing Color Output by Appearance Intent

Figure 3:
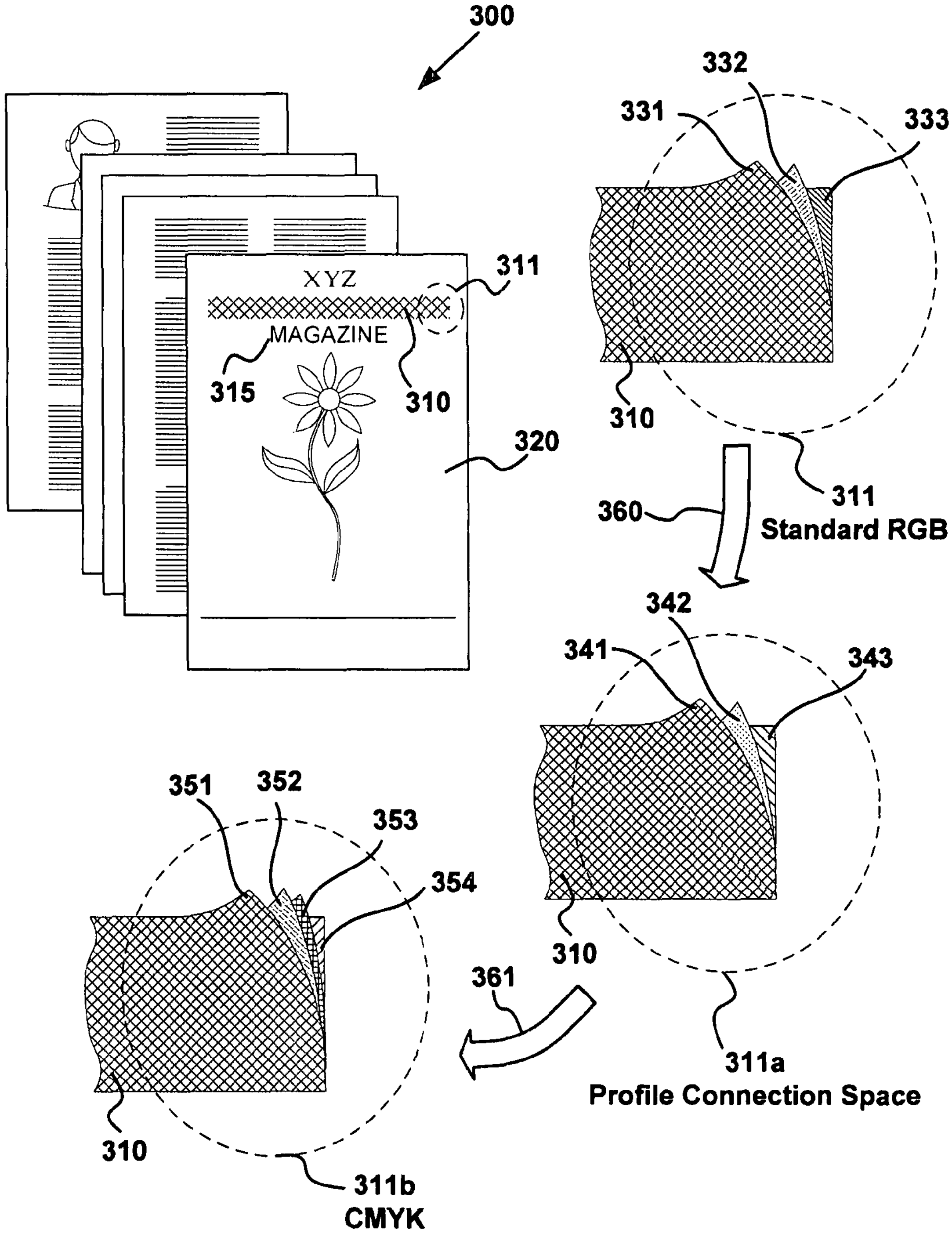
FIG. 3 is a print job, in accordance with an embodiment of the present invention.

FIG. 4 is flow diagram 400 of a method, in accordance with an embodiment of the present invention, for managing color output by appearance intent. Reference will be made to FIG. 2 and FIG. 3 in the explanation of flow diagram 400.

At 410 of flow diagram 400, in one embodiment, an input color display value comprising an appearance intent tag is received. The input color display value is associated with an item of graphic content. In accordance with an embodiment of the present invention, the input color display value is an input device color display value 201 specified in a particular color space, such as the RGB color space. With reference to FIG. 2, color specification receiver 210 receives the combination of input device color display value 210 and appearance intent tag 205; this combination comprises the receipt of a color specification for all or a portion of a particular item of graphic content.

Appearance intent tag 205 controls a conversion between a creator-specified output appearance intent and a translation of the output appearance intent to an output device color display value 240. CMS 200 recognizes both objective and subjective intent as specified within appearance intent tag 205. For example, appearance intent tag 205 may include creator intent with respect to: metamerism, graininess, economic use of color, snap, richness, transparency, purity, smoothness, and/or other output characteristics or qualities of all or a portion of an item of graphic content. Thus, it is appreciated that appearance intent tag may comprise a creator specified perceptual color display attribute, a process attribute, a subjective attribute, and/or an objective attribute.

Thus, it is appreciated that CMS 200 recognizes the vernacular of the graphic content creator, such as "snap", "richness", "transparency", "purity", and "smoothness", which may be incorporated in appearance intent tag 205, and translates such vernacular into color display values and/or commands recognizable by a an output device, such as a printer or display device. In addition to such subjective appearance intent terms, CMS 200 also recognizes objective appearance intent terms such as "cool rich black" and "process black". In accordance with an embodiment of the present invention, an appearance intent tag can control also the trade-off between metamerism, i.e. the appearance change of graphic content in different ambient light, and graininess of the graphic content.

With reference to FIG. 3, example print job 300, is presented in accordance with an embodiment of the present invention. Page 320 of job 300 contains graphic content 310 a title bar, and graphic content 315, text. It is the intent of the graphic content creator to display graphic content 310 with a quality of black that is different from the quality of black for displaying graphic content 315. For example, the graphic content creator intends to have graphic content 310 printed as soft "rich black" and text 315 printed as "pure black". It is appreciated the both "rich black" and "pure black" are objective appearance intent terms, while the term "soft" is a subjective appearance intent term.

In accordance with 410 of flow diagram 400, and in accordance with an embodiment of the present invention, a color specification comprising an input device color value 201 and an appearance intent tag 205 is received. In this example, the input device color display value 201 is specified in coordinates of a standard RGB color space specification along with an output appearance intent expressed by appearance intent tag 205. Thus, in this example, an input device color display value in standard RGB specification coordinates of (0, 0, 0) and appearance intent tag comprising instructions for "soft" "rich black" are received for graphic content 310, while an input device color display value in standard RGB specification coordinates of (0, 0, 0) and appearance intent tag comprising instructions of "pure black" are received for text 315. With reference to FIG. 3, detail 311 visually represents the three color coordinates 331, 332, and 333 that are specified by input device color display value 201 (in an RGB color space) for creating graphic content 310.

In the receiving of a color display value, such as input device color display value 201, the content of appearance intent tag 205 remains intact and unchanged. The appearance intent tag is encoded such that it is compatible with the encoding of the color specification, i.e. not interfering with interpretation of a color display value, such as input device color display value 201. Moreover, while the content of input device color display value 201 is supplemented by appearance intent tag 205, it is not altered in such a manner that a device and/or system which will be unable to read and process input device color display value 201 if it is unable to read appearance intent tag 205.

It is appreciated that in some embodiments, the received input device color display value 201 is device dependent; that is, it is specified in a color space of the input device and accompanied by an appearance intent tag 205. It is appreciated that in some embodiments, the received input device color display value 201 is device independent; that is, it is specified in an intermediate color space (such as PCS) and accompanied by an appearance intent tag 205. In an instance of receiving an input device color display value 201 in an intermediate color space, less conversion or no conversion may be performed by intermediate color value converter 214.

At 420 of flow diagram 400, in one embodiment, the color display value received at 410 is converted to an intermediate color value, such that an appearance intent specified by the appearance intent tag is preserved in the intermediate color value. In one embodiment, this comprises intermediate color value converter 214 converting the received input device color display value from an input device color space to an equivalent intermediate color value 216 in an intermediate color space (e.g., a profile connection space). The intermediate color space can be recognized and interpreted, for example, by an output device or by a device driver, either of which may comprise an output color value converter, such as output color value converter 230. Converting a received input device color display value 201 to an intermediate color value 216 allows dissimilar input and output color spaces to be linked through conversion to and from an intermediate color space that is understood for instance by an input device and an output device which operate in different color spaces from one another.

With reference to detail 311 and detail 311*a* of FIG. 3, at 420 of flow diagram 400, the standard RGB coordinates represented by 341, 342, and 343 are converted to the coordinates of an intermediate color space (such as a profile connection space) associated with intermediate color value 216. Thus, in the case of the RGB coordinates for graphic content 310, the color coordinates (represented by 331, 332, and 333) of detail 311 are converted to equivalent intermediate color coordinates, such as PCS (0, 0, 0) a which are represented by 341, 342, and 343. In one embodiment, the conversion is performed such that the output intent of soft rich black, specified in appearance intent tag 205, is preserved. In another embodiment a conversion is made to an equivalent color in the intermediate color space and appearance intent tag is included with the intermediate color value 216.

At 430 of flow diagram 400, in one embodiment, the intermediate color value created in 420 is converted into an output color display value recognizable by an output device, such that said appearance intent is preserved in said output color display value. In one embodiment, output color value converter 230 performs this conversion of intermediate color value 216 to output device color display value 240. It is appreciated that output color value converter 230 may be embodied as a device driver in a computer, such as computer system 100, or in an output device. The conversion is performed in a slightly different fashion, depending upon the device that will be receiving the output color display value 340. For example, ink/color separator 235 separates output device color display value 240 into ink amounts for a particular printer, or into color display amounts for a particular display device. The ink and/or color separation is unique to the device, such that output device particularities such as ink formulation, printing mechanism, display mechanism, screen composition, and the like may be accounted for in order to achieve the output intent specified in appearance intent tag 205. Thus, in this manner, output device color display value 240 takes the form of a device recognizable attribute such as a print command or display command that is recognized by a particular output device.

With reference to detail 311*a* and detail 311*b* of FIG. 3, and in accordance with an example embodiment of the present invention, at 430 the intermediate color value 216 for graphic content 310 is converted to an output device color display value 240. In this example the output device is a printer which operates in a CMYK color space. Detail 311*b* shows how the three color coordinates of intermediate color value 216 (represented as 341, 342, and 343 in detail 311*a*) are converted/mapped from coordinates of intermediate color value 216 to the four color coordinates (represented as 351, 352, 253, and 354) of a CMYK color space associated with an output device for which graphic content of job 300 is being converted for output. Thus, in this example, a conversion/mapping of standard RGB=(0, 0, 0) into PCS (0, 0, 0) and then into CMYK=(25, 25, 51, 255) for printing graphic content 310 has been accomplished by CMS 200, such that the appearance intent of "soft" "rich black" specified by an appearance intent tag 205 is preserved in the output device color display value 240.

Likewise, a conversion/mapping of standard RGB=(0, 0, 0) into PCS (0, 0, 0) and then into CMYK=(0, 0, 0, 255) for printing text 315 has been accomplished such that the appearance intent of "pure black" specified by an appearance intent tag 205 is preserved in the output device color display value 240.

At 440 of flow diagram 400, in one embodiment, the output device color display value 240 is output for use by an output device such as a printer or display device. This can comprise coupling output device color display value 240 to an output device such as a printer or display device, in the form of a device link command such as a print command or a display command that preserves the output intent specified by appearance intent tag 205.

Method for Late Bound Color Mapping

FIG. 5 is flow diagram 500 of a method for late bound color mapping, in accordance with an embodiment. Late bound color mapping, such as late bound color mapping, is computing the color mapping for a job at a point later in the workflow after the job has been created, such as in an output device. Reference will be made to FIG. 2 and FIG. 3 in the explanation of flow diagram 500. Print job 300 of FIG. 3 represents an example of an item of graphic content that exists as a job which may be late bound to a color mapping. For the purposes of brevity and clarity, the method of flow diagram 300 will be illustrated with print job 300. However, it is appreciated that the method for late bound color mapping is applicable to a variety of jobs, such as jobs to be printed, displayed on screens, or projected onto surfaces.

At 510 of flow diagram 500, in one embodiment, a job specified in an input space is received. The job comprises at least one item of graphic content specified in an input space. Specifying a color for a job is defining the colors of a job in either 3 dimensional additive colors, such as primary colors of RGB (red, green, blue) or 4 dimensional subtractive primary colors of CMYK (cyan, magenta, yellow, black). It is easier to specify a job in the 3 dimensional additive colors of RGB, since RGB color space is closer to the visual system that occurs in nature and is therefore more intuitive.

For example, in one embodiment, this comprises CMS 200 receiving print job 300 at color specification receiver 210.

Print job 300 represents an example print job that comprises several items of graphic content such as graphic content item 310 and graphic content item 315. Print job 300 is specified in the input space of standard RGB. In one embodiment, in step 510, color specification receiver 210 receives an input device color display value 201 associated with a portion of job 300, such as graphic content 310. For example, in one embodiment, the received input device color display value 201 specifies that graphic content 310 is the color "black" in a standard RGB color space. For example, this may be specified as the color coordinates of (0, 0, 0) in the standard RGB color space. These coordinates are represented as 331, 332, and 333 in detail 311.

Dashed box 515 highlights the portion of the method of flow diagram 500 where aspects of late binding occur. It is appreciated that 520, 530, and in some embodiments, 540 fall with in dashed box 515.

At 520 of flow diagram 500, in one embodiment, output appearance intent of a graphic content creator with respect to the input space, is determined. The output appearance intent of a creator, such as a graphic content creator, a graphic content editor, a graphic content proofer, and the like, is determined from the intent specified in appearance intent tag 205. For example, the subjective intent vernacular of the graphic content creator, which includes subjective attribute terms such as "snap," "softness", "richness," "transparency," "granularity", "smoothness," and "purity", is captured in appearance intent tag 205. It is appreciated, that other creator intents, as described previously, may also be captured in an appearance intent tag 205. Thus, it is appreciated that appearance intent tag 205 may comprise a creator specified perceptual color display attribute, a process attribute, a subjective attribute, and/or an objective attribute.

For example, in one embodiment, the output appearance intent of the creator is embodied in appearance intent tag 205 which is received by color specification receiver 210 in conjunction with receipt of input device color display value 201. With reference to example job 300, this comprises receiving an appearance intent tag 205 which specifies that graphic content 310 is to be printed as a "soft" "rich black." In this example, appearance intent tag 205 comprises a combination of subjective and objective output attribute intents that the creator of job 300 has added to the standard RGB color of black specified in the received input device color display value 201.

At 530 of flow diagram 500, in one embodiment, an appearance intent tag is applied to reflect the output appearance intent for a particular device. For example, with respect to CMS 200, an appearance intent tag 205 (associated with all of or a portion of a job such as a single page, a portion of a page, a figure, an image, a portion of text, or a pixel), controls the conversion between received input space to output device color display value 240, such that the creator's intent is preserved through the conversion process and reflected in the output. This can include applying the appearance intent tag to reflect the output appearance intent in one or more portions of the job, as specified by one or more appearance intent tags associated with those one or more portions of the job.

With reference to FIG. 3, in one embodiment, the conversion to color coordinates mapped in an intermediate color space, such as profile connection space 311*a*, is skipped. Instead, the color mappings 360 and 361 are collapsed in a single color mapping, so that the standard RGB color coordinates represented by 331, 332, and 333 are mapped directly into CMYK coordinates (25, 25, 51, 255) to achieve "soft" "rich black" in a CMYK color space of a particular output device such as a printer or display device. The color coordinates of the separate CMYK colors are represented by 351, 352, 353, and 354 of detail 311*b*. By collapsing the mappings 360 and 361 into a single step (e.g., a direct mapping from detail 311 to detail 311*b*), potential numerical stability issues are a voided, thus ensuring an accurate color mapping is obtained.

With reference to FIG. 2, It is appreciated that in one such embodiment intermediate color value converter 214 may not be utilized, and instead appearance intent tag 205 is passed from color specification receiver 210 to output color converter 230 where a conversion from input device color display value 201 is made directly to output device color display value 240.

At 540 of flow diagram 500, in one embodiment, the creator's output appearance intent is honored as a color output for a particular device. This comprises output color converter 230 outputting a color display value 240, such that the creator's output appearance intent (as specified in appearance intent tag 205) is honored. It is appreciated that in one embodiment, output color value converter 230 is embodied in a device driver, which may reside in a computer, such as computer 100, or in an output device such as a printer or display device.

In the example of FIG. 3, this comprises providing output color display value 240 for a particular device, such as a printer or a display device, for which output device color display value 240 has been late bound. In accordance with an embodiment of the present invention, honoring the appearance intent as a color output comprises performing ink separation and/or color separation with ink/color separator 235, such that output device color display value 240 is separated into ink/color that for a particular output device. For example, ink/color separator 235 separates output device color display value 240 into ink amounts for a particular printer, or into color display amounts for a particular display device. The ink and/or color separation is unique to the device, such that output device particularities such as ink formulation, printing mechanism, display mechanism, screen composition, and the like may be accounted for in order to achieve the output intent specified in appearance intent tag 205. Thus, in this manner, output device color display value 240 takes the form of a device recognizable attribute such as a print command or display command that is recognized by a particular output device.

Thus, in accordance with the method of flow diagram 500, a creator's output appearance intent, which may be a subjective intent (associated with a subjective attribute) or an objective intent (associated with an objective attribute), can be specified in an appearance intent tag 205 during the creation of the graphic content of a job. The creator's output appearance intent can then be honored in an output color value of a color space that graphic content of the job, such as job 300, is bound to after creation of the graphic content. This allows for repurposing created graphic content while preserving a creator's specified output intent for graphic content that it is printed or displayed in a color space different from the color space in which it was originally created or indented for print or display.

Although the subject matter of the present technology for managing color output by appearance intent has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A computer implemented method for managing color output by appearance intent, said computer implemented method comprising:

receiving an input color display value comprising an appearance intent tag, said input color display value associated with an item of graphic content wherein said appearance intent tag includes a human language word specified by a human creator of said graphic content;

preserving an appearance intent specified by said appearance intent tag in an intermediate color value as a part of converting said color display value to said intermediate color value; and preserving said appearance intent in an output color display value by converting said intermediate color value into said output color display value recognizable by an output device.

2. The computer implemented method of claim 1, further comprising:

outputting said output color display value to an output device.

3. The computer implemented method of claim 1, wherein said receiving an input color display value comprising an appearance intent tag comprises:

receiving an input device dependent color specification comprising said appearance intent tag.

4. The computer implemented method of claim 1, wherein said receiving an input color display value comprising an appearance intent tag comprises:

receiving an input device independent color specification comprising said appearance intent tag.

5. The computer implemented method of claim 1, wherein said receiving an input color display value comprising an appearance intent tag comprises:

receiving a standard RGB color specification comprising said appearance intent tag.

6. The computer implemented method of claim 1, wherein said receiving an input color display value comprising an appearance intent tag comprises:

receiving a creator specified perceptual color attribute in said appearance intent tag.

7. The computer implemented method of claim 1, wherein said receiving an input color display value comprising an appearance intent tag comprises:

receiving a process attribute in said appearance intent tag.

8. The computer implemented method of claim 1, wherein said receiving an input color display value comprising an appearance intent tag comprises:

receiving an input color display value comprising an appearance intent tag, wherein said appearance intent tag controls an appearance intent selected from the group of appearance intents consisting of: metamerism, graininess, economic use of color, snap, richness, transparency, purity, softness, and smoothness.

9. The computer implemented method as recited in claim 1, wherein said converting said color display value to an intermediate color value comprises:

converting said color display value into an equivalent color display value in a profile connection space such that said appearance intent is preserved in said intermediate color value.

10. The computer implemented method as recited in claim 1, wherein said converting said intermediate color value into an output color display value recognizable by an output device comprises:

converting said intermediate color value into a CMYK color display value recognizable by said output device such that a subjective creator intent specified by said appearance intent tag is preserved in said CMYK color display value.

11. A color management system comprising:

a color specification receiver configured for receiving an input color display value comprising an appearance intent tag, said input color display value associated with an item of graphic content, wherein said appearance intent tag includes a human language word specified by a human creator of said graphic content; and an output color value converter coupled with said color specification receiver and configured for preserving an appearance intent specified by said appearance tag in an output color display value by converting a received color value into said output color display value recognizable by an output device.

12. The color management system of claim 11, further comprising:

an intermediate color value converter configured for converting said input color display value to intermediate color value such that said appearance intent specified by said appearance intent tag is preserved in said intermediate color value, said intermediate color value coupled to said output color value converter.

13. The color management system of claim 11, wherein said appearance intent tag is configured for controlling a conversion between a creator-specified appearance intent and an output of a device driver.

14. The color management system of claim 11, wherein said appearance intent tag is configured for controlling an appearance intent selected from the group of appearance intents consisting of: metamerism, graininess, economic use of color, snap, richness, transparency, purity, softness, and smoothness.

15. The color management system of claim 11, wherein said output color value converter further comprises:

a separator for separating ink for an output to a printer and color for an output to a display device.

16. A method for late bound color mapping comprising:

receiving a job, wherein said job comprises an item of graphic content specified in an input space;

determining an output appearance intent of a creator with respect to said input space; and reflecting said output appearance intent for a particular device by applying an appearance intent tag that includes a human language word specified by said creator of said graphic content.

17. The method of claim 16, further comprising:

honoring said appearance intent as a color output for said particular device.

18. The method of claim 17, wherein said honoring said appearance intent as a color output for said particular device comprises:

honoring a subjective appearance intent specified by said creator during creation of said job.

19. The method of claim 16, wherein said determining an output appearance intent of a creator with respect to said input space comprises:

determining a subjective appearance intent for a portion of said job, wherein said subjective appearance intent is selected from the group of subjective appearance intents consisting of: snap, softness, richness, transparency, graininess, smoothness, and purity.

20. The method of claim 16, wherein said applying an appearance intent tag to reflect said output appearance intent for a particular device comprises:

applying said appearance intent tag to reflect said output appearance intent in a portion of said job specified by said appearance intent tag.

* * * * *